(12) United States Patent
Watanabe et al.

(10) Patent No.: US 7,331,756 B2
(45) Date of Patent: Feb. 19, 2008

(54) AXIAL-FLOW FAN UNIT AND HEAT-EMITTING ELEMENT COOLING APPARATUS

(75) Inventors: Michinori Watanabe, Nagano (JP); Toshiki Ogawara, Nagano (JP); Haruhisa Maruyama, Nagano (JP)

(73) Assignee: Sanyo Denki Co., Ltd., Tokyo (JP)

( * ) Notice: Subject to any disclaimer, the term of this patent is extended or adjusted under 35 U.S.C. 154(b) by 480 days.

(21) Appl. No.: 10/879,265

(22) Filed: Jun. 29, 2004

(65) Prior Publication Data

US 2004/0261976 A1    Dec. 30, 2004

(30) Foreign Application Priority Data

Jun. 30, 2003    (JP) .............................. 2003-189074

(51) Int. Cl.
   *F04D 29/54*    (2006.01)
(52) U.S. Cl. ..................... 415/191; 415/220; 415/221
(58) Field of Classification Search ............... 415/191, 415/220, 221, 223, 208.2, 211.2; 361/695, 361/697
   See application file for complete search history.

(56) References Cited

U.S. PATENT DOCUMENTS

| | | | |
|---|---|---|---|
| 5,519,574 A | 5/1996 | Kodama et al. | |
| 5,629,834 A | 5/1997 | Kodama et al. | |
| 6,118,198 A * | 9/2000 | Hollenbeck et al. | 310/89 |
| 6,222,731 B1 | 4/2001 | Katsui | |
| 6,480,383 B2 | 11/2002 | Kodaira et al. | |
| 6,487,079 B2 | 11/2002 | Katsui | |
| 6,671,172 B2 * | 12/2003 | Carter et al. | 361/697 |
| D501,450 S * | 2/2005 | Watanabe et al. | D13/179 |
| 6,860,323 B2 * | 3/2005 | Cheng | 165/121 |
| 6,924,983 B2 * | 8/2005 | Otsuki et al. | 361/704 |
| D509,485 S * | 9/2005 | Mochizuki et al. | D13/179 |

* cited by examiner

*Primary Examiner*—Ninh H. Nguyen
(74) *Attorney, Agent, or Firm*—Rankin, Hill, Porter & Clark LLP

(57) ABSTRACT

An axial-flow fan unit that produces less noise is provided. Blades 19 are exposed from a venturi 29. The shape of each of the blades 19 is so defined that a space formed between at least an inner surface 28a of each of web leg sections 28A to 28C and an edge 19a of each of the blades 19 located in the radially outward direction of the blades 19 expands toward the ends of the web leg sections 28A to 28C (or web bodies 30A to 30C). With this arrangement, noise produced when the blades 19 rotate along the web leg sections 28A to 28C is reduced.

6 Claims, 6 Drawing Sheets

AXIAL-FLOW FAN UNIT AND HEAT-EMITTING ELEMENT COOLING APPARATUS

BACKGROUND OF THE INVENTION

The present invention relates to an axial-flow fan unit and a heat-emitting element cooling apparatus which uses the axial-flow fan unit, for cooling a heat emitting element such as an electronic component.

Such a heat-emitting element cooling apparatus has been know that includes a heat sink having a base and a plurality of radiation fins, and a fan unit. In this apparatus, a heat-emitting element to be cooled is mounted on the rear surface of the base, and the plurality of radiation fins are fixed to the base. The fan unit is disposed above the heat sink, for blowing air along at least the radiation fins to promote heat dissipation from the radiation fins. In this heat-emitting element cooling apparatus, heat generated from the heat-emitting element is transferred from the base to the radiation fins. Then, the air flowing from the fan unit along the radiation fins carries away the heat of the radiation fins, thereby cooling the heat-emitting element.

U.S. Pat. No. 6,407,913 discloses an electronic component cooling apparatus where a heat sink provided with a plurality of radiation fins juxtaposed on a base, is cooled by a fan unit.

Japanese Patent Application No. 267093/2002 (Laid-Open Publication No. 104020/2004), which is the prior application of the applicant of the present invention, discloses an axial-flow fan unit in which the shape of a venturi is so defined that, as seen from the radially outward direction of the revolving shaft of a motor for rotating an impeller, part of a plurality of blades located on the side of the motor can be seen.

Further, U.S. Design Pat. No. 441,724 and U.S. Design Pat. No. 450,306 disclose a heat sink constituted by a radiation group comprising four space-dividing radiation fins and a plurality of subdividing radiation fins. In this heat sink, the four space-dividing radiation fins directly extend from the outer periphery of a base in the radial direction of the revolving shaft of a motor, thereby dividing a space surrounding the outer periphery of the base into four spaces. The plurality of subdividing radiation fins are located within the divided spaces in order to further subdivide the divided spaces. A part of the subdividing radiation fins respectively extend outward from two of the space-dividing radiation fins adjacent to each other, and the remaining subdividing radiation fins respectively extend outward from the outer periphery of the base located between two adjacent space-dividing radiation fins.

Like the axial-flow fan unit as shown in Japanese Patent Application No. 267093/2002 (Laid-Open Publication No. 104020/2004), in which the shape of the venturi is so defined that part of a plurality of blades located on the side of the motor can be seen as viewed from the radially outward direction of the revolving shaft of the motor for rotating the impeller, comparatively large noise might be produced.

SUMMARY OF THE INVENTION

Accordingly, an object of the present invention is to provide an axial-flow fan unit that produces less noise.

Another object of the present invention is to provide a heat-emitting element cooling apparatus that has high cooling performance and also produces less noise.

An axial-flow fan unit of which the present invention aims at improvement includes: a motor having a revolving shaft; an impeller having a plurality of blades and mounted on the revolving shaft; a cylindrical venturi surrounding the impeller in the radial direction of the revolving shaft; and a plurality of webs spaced in the radial direction, for connecting the venturi to the housing of the motor. Then, the shape of the venturi is so defined that part of the blades located on the side of the housing of the motor can be seen, as viewed from the radially outward direction. Further, each of the webs includes: a web leg section extending from the end of the venturi toward a side of the housing of the motor and having an inner surface continuous with the inner periphery surface of the venturi; and a web body located between the housing and the end of the web leg section on the side of the housing. Then, the axial-flow fan unit draws in air from the side of the motor and blows the air into the venturi.

In the axial-flow fan unit according to the present invention, the shape of each of the blades is so defined that a space formed between at least the inner surface of the web leg section and the edge of each of the blades located in the radially outward direction expands toward the end of the web leg section.

Incidentally, the space between the inner periphery surface of the venturi and the edge of each of the blades may be fixed. Then, the shapes of the blades may be so defined that a space formed among the inner periphery surface of the venturi, the inner surface, and the edge of each of the blades located in the radially outward direction expands toward the end of the web leg section.

In other words, the space is gradually expanding toward the end of the web leg section (or each of the web bodies) so as to reduce the noise produced when the edge of each of the blades moves along the inner surface of the web leg section.

According to the present invention, the noise produced when the blades rotates along the web leg sections with part of the blades protruding from the venturi can be greatly reduced. If the space is expanded too much, the volume of airflow is also reduced though the noise is decreased. On the contrary, if the space does not expand enough, the volume of the airflow is not reduced, but a reduction in noise becomes less. Thus, an increase in space expansion should be determined as necessary, based on the required volume of airflow and the desired reduction in noise. The reason why the noise is reduced is uncertain. However, actual tests have confirmed that the noise is reduced. According to the result of the tests, it is preferable that the shapes of the blades are so defined that an angle between the edge of each blade and an inner surface of a virtual cylinder, with which a radially outermost vertex of the edge of each blade is inscribed, becomes approximately 4° or more. If the angle is in this range, the noise can be reduced without substantially decreasing the volume of the airflow. Preferably, the major parts of the respective edges of the blades are formed to be inscribed in a common virtual cone. Generally, the edges of the blades on the side of the housing have arcs (curvatures). It is considered that the curvature of the arcs does not significantly affect the reduction of the noise so much.

Preferably, the inner surface of the web leg section is continuous with the inner periphery surface of the venturi and is curved along the inner periphery surface. In this case, the curvature of the inner surface becomes substantially the same as that of the inner periphery surface of the venturi. With this arrangement, a reduction in noise with respect to an increase in space expansion can be increased.

A heat-emitting element cooling apparatus of which the present invention aims at improvement includes: a heat sink including a base with a heat-emitting element to be cooled mounted on a rear surface thereof and a heat radiation fin group constituted by a plurality of radiation fins, fixed to the base; and an axial-flow fan unit arranged above the heat sink, for blowing air along at least the radiation fins constituting the radiation fin group to promote heat dissipation from the radiation fins. Then, the base of the heat sink has a columnar shape. Further, the radiation fins are disposed outside the base in a radial direction of the base. More specifically, the radiation fins are directly or indirectly fixed to the columnar base, and extend both in the radially outward direction of the base and the height direction of the outer periphery surface of the base or the direction extending from the fan unit to the heat sink. A preferred fan unit is the axial-flow fan unit of the present invention.

The radiation fin group in the heat sink can be constituted by: two or more space-dividing radiation fins directly extending from the outer periphery of the base in the radially outward direction, for dividing a space surrounding the outer periphery of the base into a plurality of divided spaces; and a plurality of subdividing radiation fins located within the divided spaces. A part of the subdividing radiation fins respectively extend outward from two of the space-dividing radiation fins adjacent to each other and the remaining subdividing radiation fins respectively extend outward from the outer periphery of the base arranged between two adjacent space-dividing radiation fins so that the divided spaces are further subdivided. With this arrangement, compared with the case where the radiation fins are radially arranged with respect to the base, the total surface area of the radiation fins can be increased. For this reason, the cooling performance of the apparatus can be improved.

Preferably, the subdividing radiation fins located within each of said divided spaces are inclined in a direction opposite to the rotating direction of the impeller. With this arrangement, the cooling effect of the apparatus can be enhanced. Though the reason for this is not clear, it is considered that the cooling effect can be enhanced because cooling airflow efficiently strikes the fins.

Preferably, the shapes of the two or more space dividing radiation fins may be so defined that enough heat dissipation can be performed through the subdividing radiation fins joined to the respective space dividing radiation fins.

According to the present invention, the noise produced when the blades rotate along the web leg sections with part of the blades protruding from the venturi can be greatly reduced.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein.

DETAILED DESCRIPTION OF PREFERRED EMBODIMENT

Figure 2:
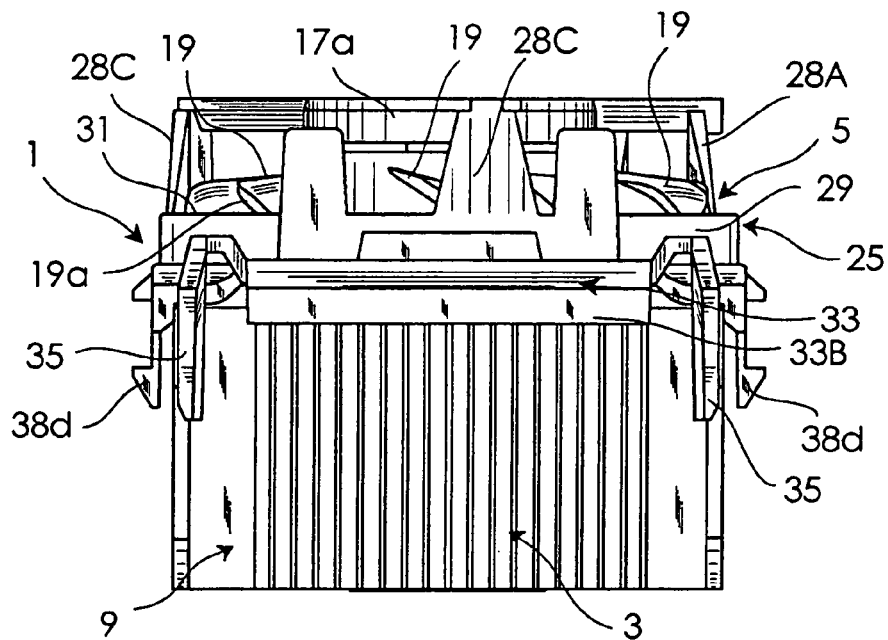
FIG. 2 is a right-side elevation view of the heat-emitting element cooling apparatus according to the embodiment of the present invention, applied to the electronic component cooling apparatus.
Figure 3:
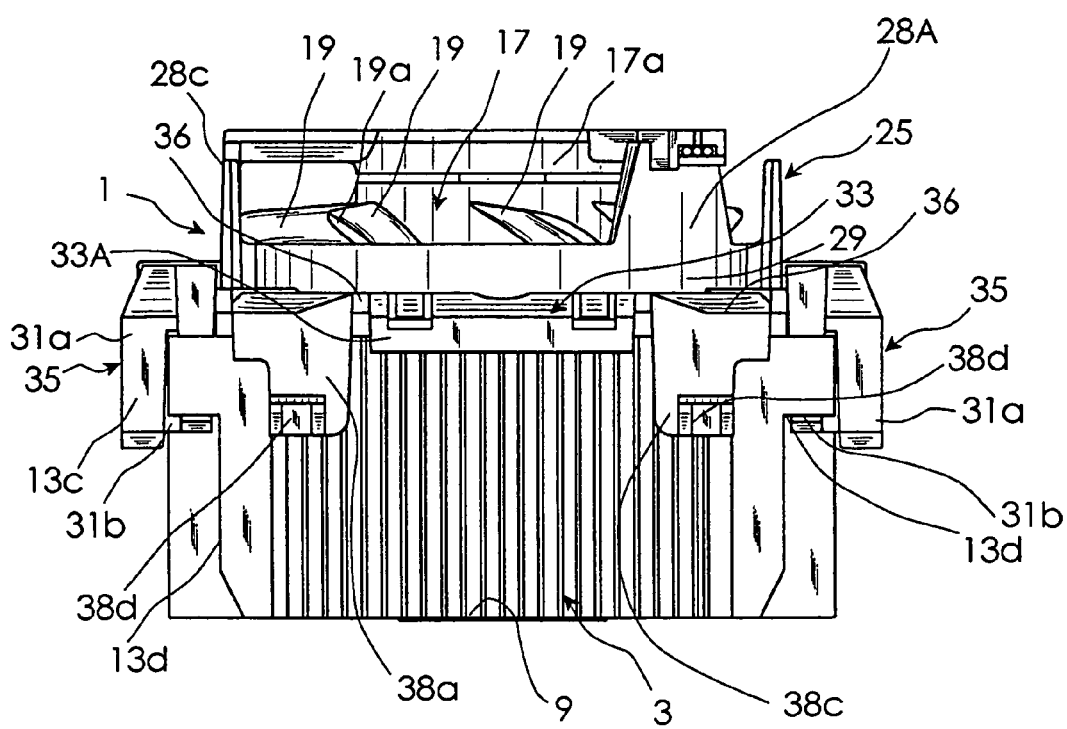
FIG. 3 is a front elevation view of the heat-emitting element cooling apparatus according to the embodiment of the present invention, applied to the electronic component cooling apparatus.
Figure 4:
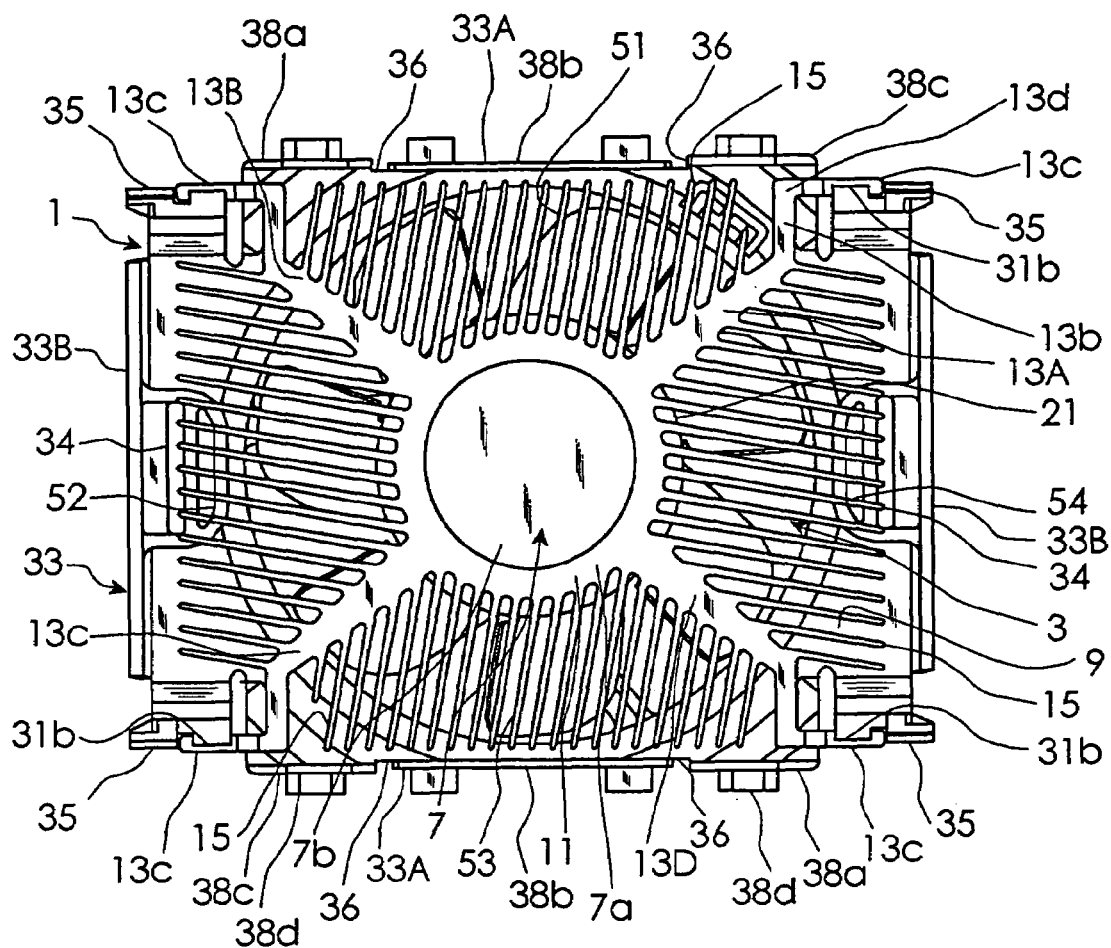
FIG. 4 is a bottom plan view of the heat-emitting element cooling apparatus according to the embodiment of the present invention, applied to the electronic component cooling apparatus.
Figure 5:
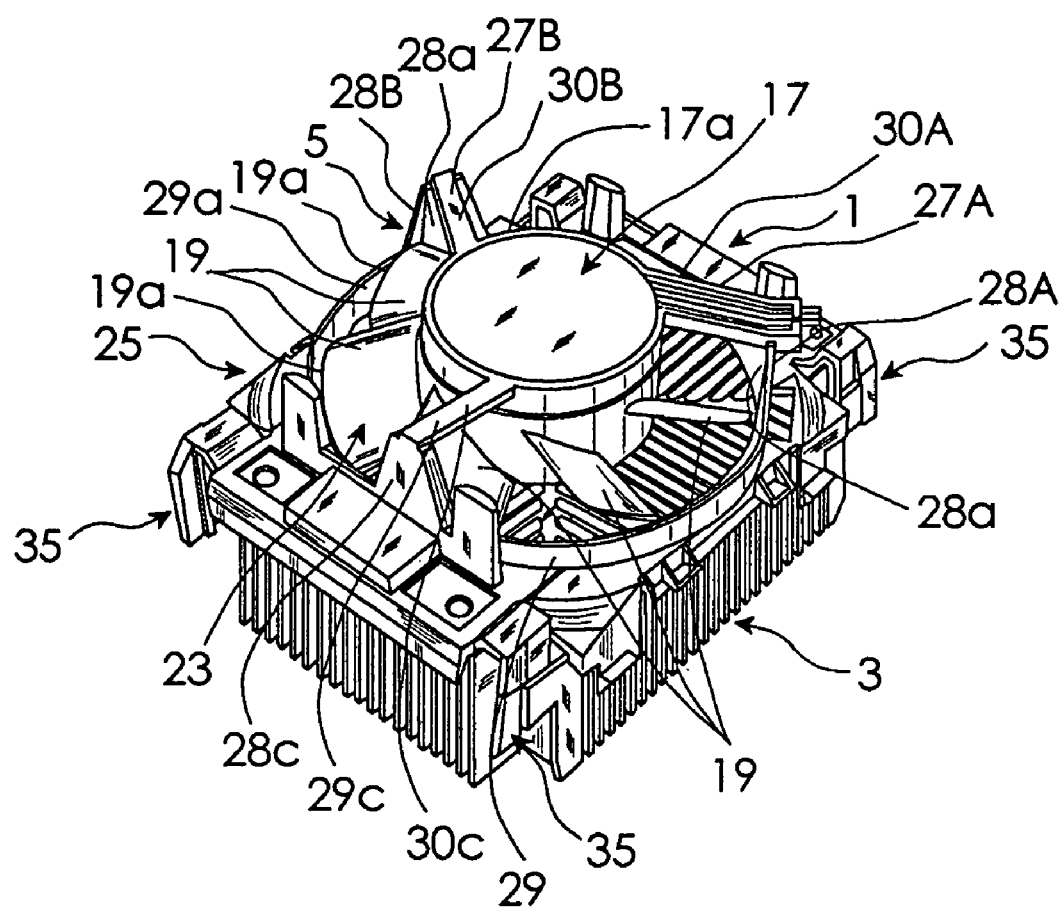
FIG. 5 is a perspective view of the electronic component cooling apparatus.
Figure 6:
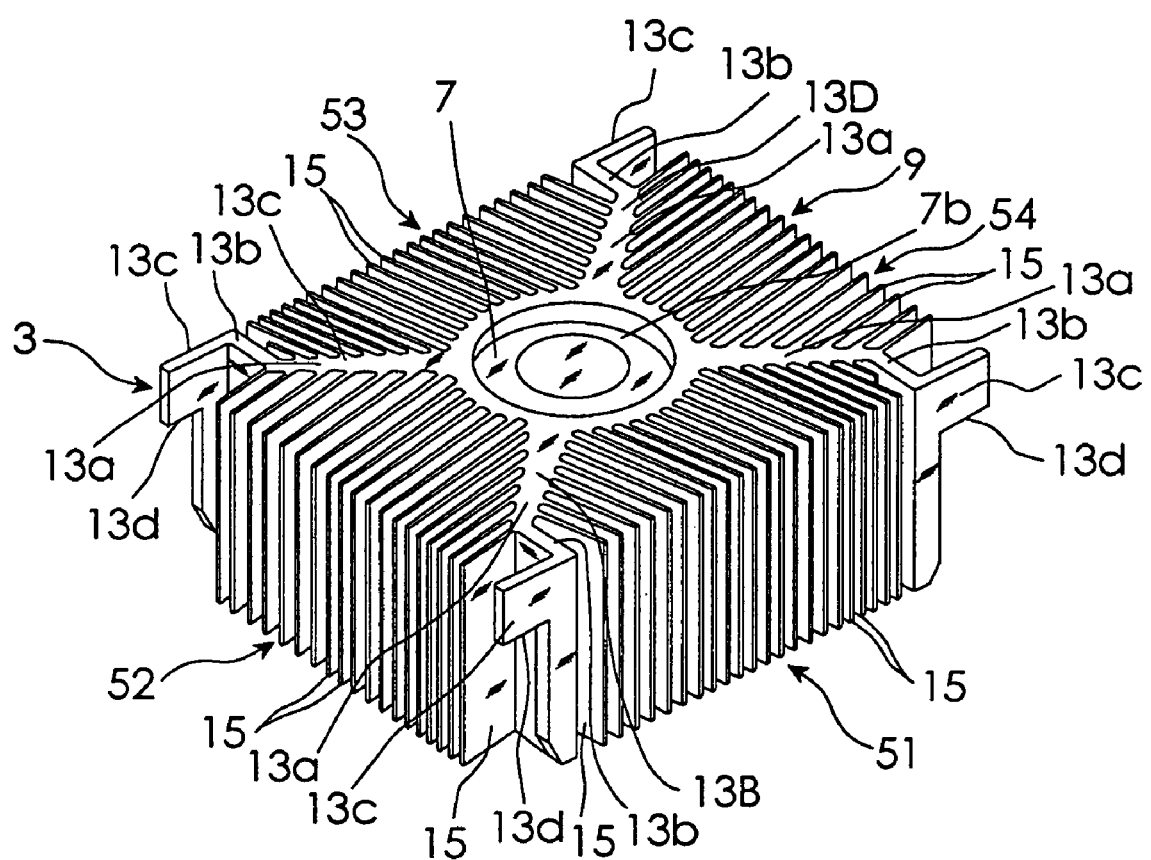
FIG. 6 is a perspective view of a heat sink of the electronic component cooling apparatus.

FIGS. 1 to 4 are respectively a top plan view, a right-side elevation view, a front elevation view, and a bottom plan view of a heat-emitting element cooling apparatus according to an embodiment of the present invention, which is applied to an electronic component cooling apparatus. FIG. 5 is a perspective view of an electronic component cooling apparatus 1 illustrated in FIGS. 1 to 4. FIG. 6 is a perspective view of a heat sink 3 used in the electronic component cooling apparatus. FIGS. 7(A) to 7(C) are respectively a front view, a plan view, partially broken away, and a rear view of an impeller used in the electronic component cooling apparatus. As shown in these drawings, the electronic component cooling apparatus 1 in this embodiment includes the heat sink 3 and an axial-flow fan unit 5. As illustrated in FIG. 4, the heat sink 3 includes a base 7 and a radiation fin group 9 fixed to the base 7. The base 7 is constituted by a cylindrical hollowed central section 7a including a cavity in its inside and a high thermal conductor 7b. The high thermal conductor 7b is arranged within the cavity so that it can conduct heat to the cylindrical hollowed central section 7a and has a thermal conductivity higher than that of a material employed for forming the hollowed central section 7a. The high thermal conductor 7b is formed of copper having a thermal conductivity higher than the thermal conductivity of the material (i.e. aluminum) for the radiation fin group 9 and the hollowed central section 7a, and has substantially a cylindrical shape. The diameter of the base 7 (outer dimensions of the hollowed central section 7a) is equal to or less than the outer dimensions of an impeller 23 of the axial-flow fan unit 5 described hereinafter.

As illustrated in FIG. 4, the radiation fin group 9 is fixed to the outer periphery of the base 7. A heat-emitting element constituted by an electronic component to be cooled is mounted on the rear surface of the base 7 or a bottom surface 7c opposite to the side where the axial-flow fan unit 5 is located. This heat sink 3 is so constructed that all of radiation fins 13A to 13D and 15 of the radiation fin group 9 are located outside the contour of the base 7 or the cylindrical hollowed central section 7a, as seen from the side where the axial-flow fan unit 5 is disposed.

The radiation fin group 9 is constituted by four space-dividing radiation fins 13A to 13D integrally fixed to the cylindrical hollowed central section 7a and the subdividing radiation fins 15 fixed to the hollowed central section 7a and the space-dividing radiation fins 13A to 13D. Referring to FIGS. 4 and 6, the structure of the radiation fin group 9 will be described. Each of the four space-dividing radiation fins 13A to 13D includes a plate-like fin body 13a fixed to the hollowed central section 7a, a first plate-like portion 13b fixed to the tip of the fin body 13a, and a second plate-like portion 13c fixed to the tip of the first plate-like portion 13b. The fin body 13a has a shape of which the thickness or dimension in the peripheral direction of the hollowed central section 7a gradually decreases from its base integrally fixed to the hollowed central section 7a to its tip or in the radially outward direction of the hollowed central section 7a. This shape is so defined that enough heat dissipation can be performed through the subdividing radiation fins 15. The first plate-like portion 13b and the second plate-like portion 13c are so arranged that the cross section or the shape of them as seen from the rear surface of the heat sink 3 is of an L shape. Further, the four space-dividing radiation fins 13A to 13D are so arranged that the second plate-like portion 13c of the space-dividing radiation fin 13A is parallel to the second plate-like portion 13c of the space-dividing radiation fin 13D, and that the second plate-like portion 13c of the space-dividing radiation fin 13B is parallel to the second plate-like portion 13c of the space-dividing radiation fin 13C. As illustrated in FIG. 3 and FIG. 6, each of the second plate-like portion 13c has a lower end surface 13d. These lower end surfaces 13d constitute engaged sections to be engaged with engagement pieces 35 of a fan casing 25 described hereinafter.

The four space-dividing radiation fins 13A to 13D directly extend radially from the hollowed central section 7a and then divides a space surrounding the outer periphery of the base 7 into four divided spaces S1 to S4. More specifically, the two space-dividing radiation fins 13A and 13C are arranged at two locations mutually 180° apart in the peripheral direction of the base 7. Further, the two space-dividing radiation fins 13B and 13D are arranged at another two locations mutually 180° apart in the peripheral direction of the base 7.

The subdividing radiation fins 15 are located within the divided spaces S1 to S4 for further subdividing the divided spaces S1 to S4. The subdividing radiation fins 15 located between the two adjacent space-dividing radiation fins 13A and 13B, 13B and 13C, 13C and 13D, and 13D and 13A extend outward from such two adjacent space-dividing radiation fins and the hollowed central section 7a located between the two adjacent space-dividing radiation fins. A plurality of the subdividing radiation fins 15 located within each of the divided spaces S1 to S4 are inclined in a direction opposite to the rotational direction of the impeller 23 described hereinafter, or the direction of an arrow in FIG. 1. With this arrangement, the effect of cooling can be enhanced.

As illustrated in FIGS. 1 through 3 and FIG. 5, the axial-flow fan unit 5 includes a motor 17, the impeller 23 having seven blades 19 and a cup-like blade mounting section 21 (illustrated in FIG. 2) for being driven for rotation by the motor 17, the fan casing 25, and three webs 27A to 27C. Then, the axial-flow fan unit 5 draws in air from the side where the webs 27A to 27C are disposed, and operates to blow air toward the radiation fin group 9. In this embodiment, the fan casing 25, a housing 17a of the motor 17, and the webs 27A to 27C are integrally formed using a molding compound mainly made of a synthetic resin material In the axial-flow fan unit 5, the motor having a revolving shaft not shown is used as a driving source, and the impeller 23 mounted on the revolving shaft is rotated with respect to the revolving shaft. The axial-flow fan unit 5 is mounted on the heat sink 3 so that the rotation center of the revolving shaft is substantially aligned with the center of the base 7 of the heat sink 3. In this embodiment, the outer dimensions of the base 7 (cylindrical hollowed central section 7a) are set to be smaller than the outer dimensions of the blade mounting section 21.

Figure 1:
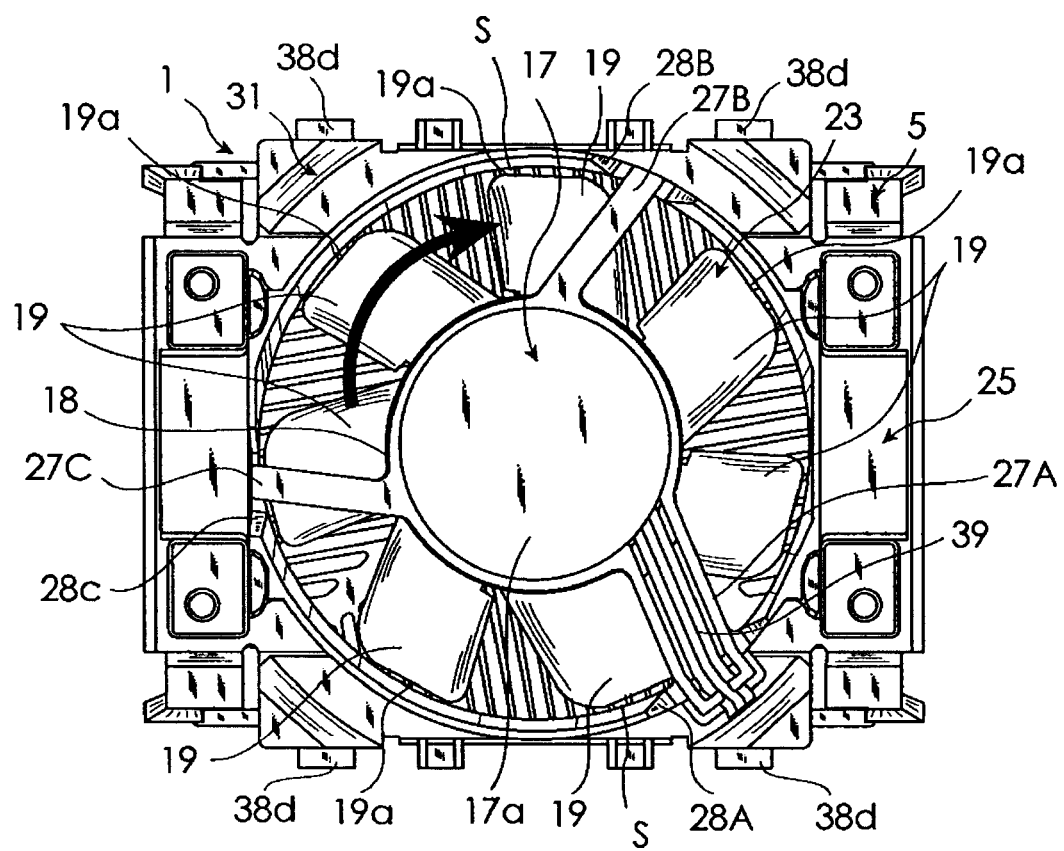
FIG. 1 is a top plan view of a heat-emitting element cooling apparatus according to an embodiment of the present invention, applied to an electronic component cooling apparatus.

As illustrated in FIGS. 1 to 5 in detail, the fan casing 25 includes a cylindrical venturi 29 for rotatably receiving the impeller 23, an opposite wall section 31 located outside the venturi 29 to face the heat sink 3, a peripheral wall section 33 provided at the opposite wall section, which extends toward the base 7, and the four engagement pieces 35 provided at the opposite wall section 31. As illustrated in FIGS. 2, 3, and 5, the shape of the venturi 29 is so defined that part of the blades 19 located on the side of the housing 17a of the motor 17 can be seen from the radially outward direction of the revolving shaft of the motor. In other words, since the dimension of the venturi 29 in its axis line direction is short, part of the blades 19 are exposed from one opening end of the venturi 29. The venturi 29 has a first taper section at its opening end on the side of the housing of the motor 17, which is widened in the radially outward direction of the revolving shaft of the motor, a straight line section with the same diameter size, continuous with the first taper section, and a second taper section that is widened in the radially outward direction, continuous with the straight line section. Inner surfaces 28a of web leg sections 28A to 28C described hereinafter are continuous with the straight line section in an inner periphery surface 29a of the venturi 29.

As illustrated in FIG. 4, at the opposite wall section 31 of the fan casing 25, two spacer means 34 are arranged between the opposite wall section 31 and the radiation fin group 9, for forming a space between the opposite wall section 31 and the radiation fin group 9 and also maintaining the space.

As illustrated in FIGS. 3 and 4, the peripheral wall section 33 has a first pair of side walls 33A facing part of the subdividing radiation fins 15 within the two divided spaces S1 and S3 described before in the lateral direction of the fan casing 25 and a second pair of side walls 33B facing the subdividing radiation fins 15 within the two divided spaces S2 and S4 in the lateral direction of the fan casing 25. The first pair of side walls 33A are constituted by three side wall portions 38a, 38b, and 38c, which are divided by two slits 36. The two side wall portions 38a and 38c on both sides are provided with hooks 38d (illustrated in FIG. 2) for engaging with metal mountings not shown. The slits 36 permit the side wall portions 38a and 38c to be inclined inward when the side wall portions 38a and 38c are subject to an external force. The first pair of the side walls 33A and the second pair of side walls 33B form a space between the opposite wall section 31 and the heat sink 3 for passing the air discharged from the impeller 23, and are arranged to prevent all or most part of the air that has passed through this space from being directly discharged to outside the fan casing 25 without passing through intervals among the subdividing radiation fins 15.

As illustrated in FIGS. 3 and 5, each of the four engagement pieces 35 has a main body section 31a that extends from the opposite wall section 31 toward the heat sink 3 and an engagement projecting section 31b that projects toward the base 7 from the edge of the main body section 31a on the side of the heat sink 3. The engagement projecting sections (or hooks) 31b of the four engagement pieces 35 are snap-in engaged with the lower end surfaces 13d in the second plate-like portions 13c at the tips of the space-dividing radiation fins 13A to 13D. In this manner, the axial-flow fan unit 5 is detachably mounted on the heat sink 3.

As illustrated in FIGS. 1 and 5, the three webs 27A to 27C are arranged between the fan casing 25 and the motor 17, and then supports the motor 17. The three webs 27A to 27C include web leg sections 28A to 28C and web bodies 30A to 30C, respectively. Each of the web leg sections 28A to 28C has the inner surface 28a that extends from the end of the venturi 29 to the housing 17a of the motor 17 and is also continuous with the inner peripheral surface 29a of the venturi 29. The web bodies 30A to 30C are located between the housing 17a and the ends of the web leg sections 28A to 28C, respectively.

In this axial-flow fan unit 5, the shape of each of the blades 19 is so defined that a space S formed between at least the inner surface 28a of each of the web leg sections 28A to 28C and an edge 19a located in the radially outward direction of each of the blades 19 expands toward the ends of the web leg sections 28A to 28C (or web bodies 30A to 30C). With this arrangement, noise produced when the blades 19 rotate along the web leg sections 28A to 28C, with part of the blades 19 protruding from the venturi 29, can be greatly reduced.

Incidentally, the space between the inner periphery surface 29a of the venturi 29 and the edge 19a of each of the blades 19 may be fixed. Then, the shape of each of the blades 19 may be so defined that the space formed among the inner surface 28a of each of the web leg sections 28A to 28C, the inner periphery surface 29a of the venturi 29, and the edge 19a located in the radially outward direction of each of the blades 19 expands toward the ends of the web leg sections 28A to 28C. In other words, in order to reduce the noise produced when the edges 19a of the blades 19 move along the inner surfaces 29a of the web leg sections 28A to 28C, the space may expand gradually toward the ends of the web leg sections 28A to 28C (or the web bodies).

In this embodiment, the inner surfaces 28a of the web leg sections 28A to 28C are continuous with the inner peripheral surface 29a of the venturi 29 and are curved along the inner peripheral surface 29a. As a result, the curvature of the inner surfaces 28a of the web leg sections 28A to 28C becomes substantially the same as that of the inner peripheral surface 29a of the venturi 29. With this arrangement, a reduction of the noise with respect to an increase in space expansion described before can be increased.

Figure 7:
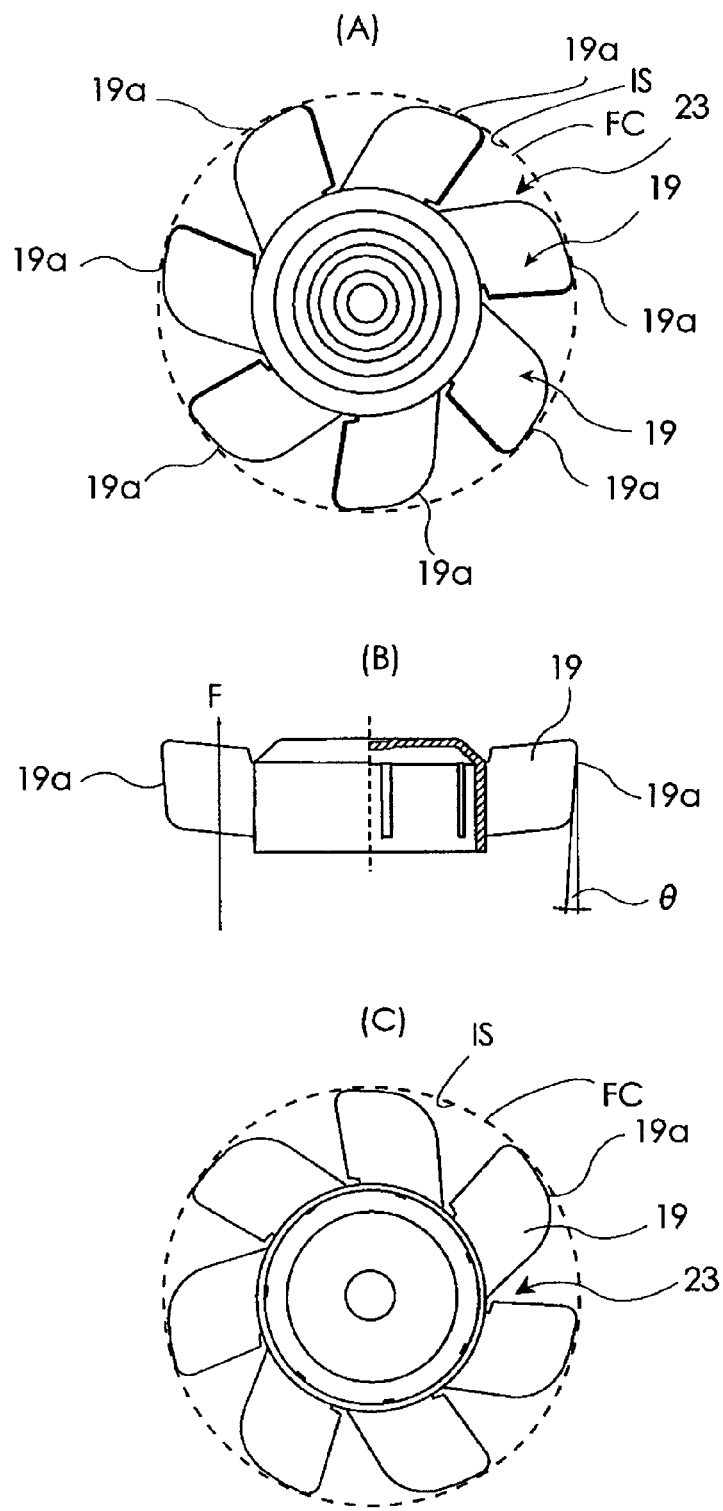
FIG. 7(A) is a front view of an impeller used in the electronic component cooling apparatus.
FIG. 7(B) is a plan view, partially broken away, of the impeller used in the electronic component cooling apparatus.
FIG. 7(C) is a rear view of the impeller used in the electronic component cooling apparatus.

The shape of the impeller 23 for forming the above-mentioned space is as illustrated in FIG. 7. As illustrated in FIG. 7(A) and 7(C), it is preferable that the shapes of the blades are so defined that an angle θ between the edge 19a and an inner surface IS of a virtual cylinder FC, with which the outermost vertices in the radial direction of the edges 19a of the blades 19 are inscribed, becomes approximately 4° or more. In this embodiment, the major parts of the respective edges 19a of the blades 19 are inscribed in a common virtual cone located inside the virtual cylinder FC having the inner surface IS. Thus the angle θ can also be defined to be the angle formed between the inner surface IS of the virtual cylinder FC and the virtual cone surface. Though this angle θ may vary depending on the shapes of the respective blades, when this angle θ is within a range of 4°+−0.5°, for example, a preferable result of noise reduction can be obtained. However, the proper range of the angle θ may vary depending on the shapes of surrounding members, the shape and dimensions of the blades, and the rotational speed of the motor. Therefore, the proper range cannot necessarily be determined at the present stage. Nevertheless, it is confirmed by experiment that, by determining the angle θ as necessary, the noise can be reduced without substantially reducing the volume of the airflow delivered from the fan unit. An arrow F in FIG. 7(B) indicates the direction of the airflow while the impeller 23 is rotating.

As illustrated FIG. 7, arcs (curvatures) are formed at the ends on both sides of the edge 19a in each of the blades 19 in the axial line direction of the blades. Tests were conducted on the effect of an arc (curvature) 19b located on the side of the housing 17a of the motor 17 in particular. Regardless of whether the curvature radius of the arc (curvature) 19b is large or small, reduction of the noise was not greatly affected. However, in regard to the arc (curvature) 19b, a larger curvature radius of the arc is considered to more contribute to the noise reduction than a smaller curvature radius of the arc.

Out of the webs 27A to 27C, electrical wires 39 for supplying power to the motor 17 are arranged inside the web 27A. Further, as illustrated in FIG. 1, the web bodies 30A to 30C of the three webs 27A to 27C, respectively, extend in the tangent direction of the revolving shaft rather than in the radial direction of the revolving shaft.

Further, the present invention is not limited to this embodiment, but various variations and modifications may be made without departing from the scope of the present invention.

What is claimed is:

1. An axial-flow fan unit comprising:
   a motor having a revolving shaft;
   an impeller having a plurality of blades and mounted on said revolving shaft;
   a cylindrical venturi surrounding said impeller in a radial direction of said revolving shaft; and
   a plurality of webs spaced in a circumferential direction of said revolving shaft, for connecting said venturi to a housing of said motor;
   a shape of said venturi being so defined that part of said blades located on a side of said housing of said motor can be seen as viewed from the radially outward direction;
   each of said webs comprising:
   a web leg section extending from an end of said venturi toward a side of said housing of said motor; and
   a web body located between said housing and an end of said web leg section on the side of said housing;
   said web leg section having an inner surface continuous with an inner periphery surface of said venturi; and
   said axial-flow fan unit drawing in air from a side of said motor and blowing the air into said venturi;
   wherein a shape of each of said blades is so defined that a space formed between at least said inner surface of said web leg section and an edge of each of said blades located in the radially outward direction expands toward said end of said web leg section.

2. The axial-flow fan unit according to claim 1, wherein said space gradually expands toward said end of said web leg section so as to reduce noise produced when said edge of each of said blades moves along said inner surface of said web leg section.

3. The axial-flow fan unit according to claim 1, wherein shapes of said blades are so defined that an angle between said edge and an inner surface of a virtual cylinder, with which a radially outermost vertex of said edge of each of said blades is inscribed, becomes approximately 4° or more.

4. An axial-flow fan unit comprising:
   a motor having a revolving shaft;
   an impeller having a plurality of blades and mounted on said revolving shaft;

a cylindrical venturi surrounding said impeller in a radial direction of said revolving shaft; and a plurality of webs spaced in a circumferential direction of said revolving shaft, for connecting said venturi to a housing of said motor;

a shape of said venturi being so defined that part of said blades located on a side of said housing of said motor can be seen as viewed from the radially outward direction;

each of said webs comprising:

a web leg section extending from an end of said venturi toward a side of said housing of said motor; and a web body located between said housing and an end of said web leg section on the side of said housing;

said web leg section having an inner surface continuous with an inner periphery surface of said venturi and curved along said inner periphery surface; and a shape of each of said blades being so defined that a space formed among said inner periphery surface, said inner surface, and an edge of each of said blades located in the radially outward direction expands toward said end of said web leg section.

5. The axial-flow fan unit according to claim 4, wherein said space gradually expands toward said end of said web leg section so as to reduce noise produced when said edge of each of said blades moves along said inner surface of said web leg section.

6. The axial-flow fan unit according to claim 4, wherein shapes of said blades are so defined that an angle between said edge and an inner surface of a virtual cylinder, with which a radially outermost vertex of said edge of each of said blades is inscribed, becomes approximately 4° or more.

* * * * *